United States Patent [19]
Barsan et al.

[11] Patent Number: 5,672,521
[45] Date of Patent: Sep. 30, 1997

[54] METHOD OF FORMING MULTIPLE GATE OXIDE THICKNESSES ON A WAFER SUBSTRATE

[75] Inventors: Radu M. Barsan, Cupertino; Xiao-Yu Li; Sunil Mehta, both of San Jose, all of Calif.

[73] Assignee: Advanced Micro Devices, Inc., Sunnyvale, Calif.

[21] Appl. No.: 561,306

[22] Filed: Nov. 21, 1995

[51] Int. Cl.$^6$ .................................................. H01L 21/266
[52] U.S. Cl. .................... 437/24; 437/43; 148/DIG. 116; 148/DIG. 163
[58] Field of Search ................... 437/24, 43, 979, 437/985; 148/DIG. 116, DIG. 163

[56] References Cited

U.S. PATENT DOCUMENTS

| | | | |
|---|---|---|---|
| 4,651,406 | 3/1987 | Shimizu et al. | 437/43 |
| 4,716,126 | 12/1987 | Cogan | 437/24 |
| 5,330,920 | 7/1994 | Soleimani et al. | 437/24 |
| 5,432,114 | 7/1995 | O | 437/979 |
| 5,532,181 | 7/1996 | Takebuchi et al. | 437/43 |

*Primary Examiner*—Chandra Chaudhari
*Attorney, Agent, or Firm*—Fliesler, Dubb, Meyer & Lovejoy

[57] ABSTRACT

An integrated circuit device and manufacturing process wherein a first region is formed in a substrate with a dopant that enhances oxide formation and a second region is formed in the substrate with a dose of nitrogen that retards oxide formation. An oxide layer is grown over the first and the second regions and over a third region of the substrate such that the first, second, and third regions yield differing thicknesses of the oxide layer.

24 Claims, 10 Drawing Sheets

ONE STEP OXIDE FORMATION

ONE STEP OXIDE FORMATION

METHOD OF FORMING MULTIPLE GATE OXIDE THICKNESSES ON A WAFER SUBSTRATE

BACKGROUND OF THE INVENTION

1. Field of invention

The present invention pertains to the field of integrated circuit device manufacturing processes. More particularly, this invention relates to the formation of multiple oxide layer thicknesses on the same silicon wafer substrate.

2. Art Background

Prior integrated circuit devices commonly contain transistors and other circuit elements that operate at differing voltage levels. For example, prior integrated circuit devices that contain non-volatile memories usually contain both high and low voltage circuit elements. Such non-volatile memories typically include circuit elements that operate at relatively high voltage levels for program and erase operations as well as other circuit elements that operate at relatively low voltage levels.

High voltage circuit elements such as program and erase transistors are usually formed on a wafer substrate with relatively thick gate oxide layer. Such relatively thick gate oxide layers are usually required to prevent transistor circuit breakdown in such a high voltage operating environment. On the other hand, it is preferable that the low voltage circuitry is implemented with relatively thin gate oxide layers on the wafer substrate. Such thin gate oxide layers typically increase the speed of such circuit elements. For example, transistor elements having relatively short gate lengths and thin oxide layers typically provide increased operating speeds.

In addition, as process technologies evolve toward shorter and shorter gate lengths it is desirable to reduce the thickness of the gate oxide layer even further in order to achieve greater operating speed. However, some circuit elements contained on such integrated circuit devices may not be scalable.

For example, non-volatile memories commonly require the formation of tunnel capacitors that include tunnel oxide layers on the wafer substrate. Such tunnel capacitors are common in non-volatile memories such as electrically erasable programmable read-only memories (EEPROM) and programmable logic devices (PLD). Such tunnel oxide layers may be thinner than high voltage oxide layers on the wafer substrate. However, such tunnel oxide layers usually cannot be scaled down in thickness in the same manner as low voltage oxide layers. Such tunnel capacitors, for example, typically suffer from significant endurance and data retention problems if the tunnel oxide layers are too thin.

Therefore, non-volatile memories can usually benefit from the formation of at least three differing oxide thicknesses on the same wafer substrate. Transistors with relatively thick oxide layers can accommodate high voltage program and erase operations while logic transistors with relatively thin oxide layers can yield speed advantages as process technologies evolve toward smaller circuit element dimensions. In addition, the thickness of oxide layers for tunnel capacitors can be scaled for reliability independent of the gate dimensions and oxide thicknesses of the high and low voltage transistors.

One prior method of forming such differing oxide layer thicknesses on the same substrate involves multiple masking and oxide formation steps. Typically, a first oxide sublayer of the thickest oxide is initially grown onto the wafer substrate. Thereafter, the first oxide sublayer is usually masked with a resist layer and the remaining unmasked oxide is stripped away from the wafer substrate. Thereafter, the resist layer is typically stripped from a surface of the first oxide sublayer and a second oxide sublayer is grown onto the silicon wafer substrate and the first oxide sublayer. The second oxide sublayer forms a thin oxide layer while the thick oxide layer results from the combination of two oxide formation cycles.

Unfortunately, the resist layer used to mask the first oxide sublayer usually leaves residues on the first oxide sublayer after removal. Such a resist residue on the first oxide sublayer typically reduces the overall quality of the subsequent oxide sublayer thermally grow thereafter. Moreover, such a prior method requires the performance of multiple resist layer and oxide layer formation steps in the manufacturing process. Such extra steps typically increase the overall costs of such a manufacturing process and degrade reliability as well as yield.

In another prior method, a first oxide layer of the thickest oxide is initially grown onto a wafer substrate and is masked with a resist layer. The remaining unmasked oxide is then etched back to form the thinner oxide layer. Unfortunately, such an etching step to form the thinner oxide is usually difficult to control and hinders the precision with which oxide layers are formed.

It has been suggested that nitrogen implantation may be employed to retard oxide growth on specified areas of the silicon wafer substrate. However, techniques that involve nitrogen implantation usually require separate masking and implantation steps for each of the differential oxide thicknesses. Unfortunately, such multiple masking and nitrogen implantation steps increases the overall cost of such a manufacturing process.

SUMMARY AND OBJECTS OF THE INVENTION

One object of the present invention is to form oxide regions of differing thicknesses on the same silicon substrate.

Another object of the present invention is to form multiple oxide regions having differing thicknesses on the same silicon wafer substrate using a single oxide formation step.

A further object of the present invention is to employ process steps that both retard the formation of oxide regions and enhance the formation of oxide regions on the same silicon wafer substrates.

These and other objects are provided by an integrated circuit manufacturing process including the steps of forming a first region in a substrate wherein the first region contains a dopant that enhances oxide formation and forming a second region in the substrate wherein the second region contains a dose of nitrogen that retards oxide formation and possibly a dopant that enhances oxide formation. An oxide layer is grown over the first and the second regions and over a third region of the substrate such that the first, second, and third regions yield differing thicknesses of the oxide layer.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

FIGS. 1a–1d illustrate a process of forming multiple oxide thicknesses on a silicon wafer substrate 10. For one embodiment, the silicon wafer substrate 10 implements a non-volatile memory. In another embodiment, the silicon wafer substrate 10 implements a PLD.

Initially, a doped n type region is formed into the silicon wafer substrate 10 which is p type. For the non-volatile memory or PLD implemented on the silicon wafer substrate 10, the doped n type region is a highly doped n-type programming junction.

Figure 1A:
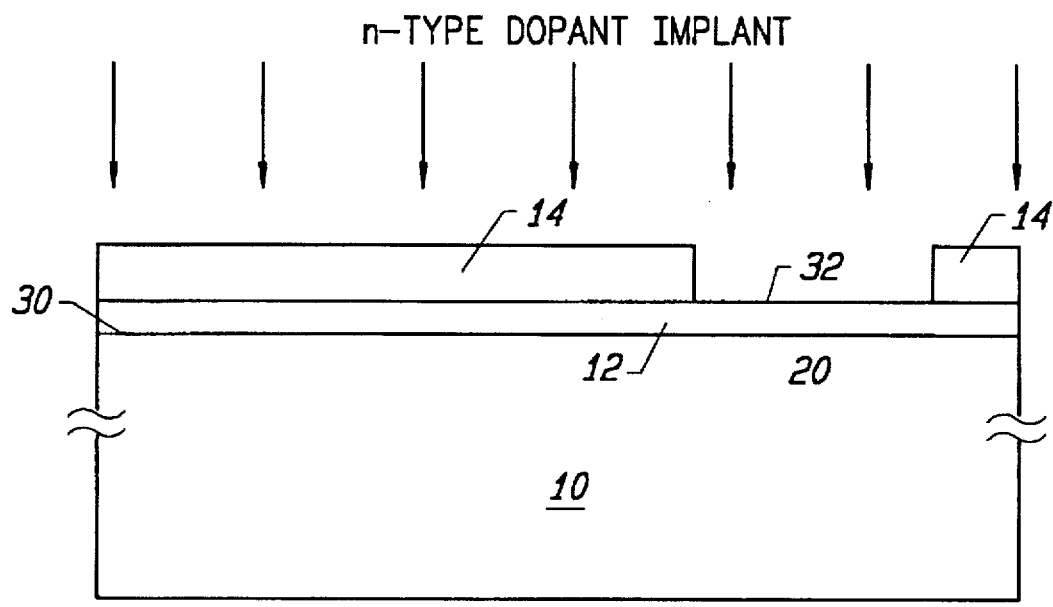
FIGS. 1a–1d illustrate a process for forming multiple oxide thicknesses on a silicon wafer substrate using a single oxide formation step.

FIG. 1a illustrates the formation of a programming junction into the silicon wafer substrate 10 in one embodiment. An oxide layer 12 is grown onto a surface 30 of the silicon wafer substrate 10. The oxide layer 12 may be referred to as a sacrificial oxide layer. In one embodiment, the oxide layer 12 has a thickness of approximately 150Å.

A masking layer 14 is then formed onto a surface 32 of the oxide layer 12. The masking layer 14 provides an opening to the surface 32 that allows an n-type dopant implant into the silicon wafer substrate 10 through the oxide layer 12. The n-type dopant is implanted into a region 20 of the silicon wafer substrate 10 through the opening provided by the masking layer 14. Thereafter, the silicon wafer substrate 10 undergoes an anneal step which diffuses the implanted n-type dopant. The annealing of the n-type dopant forms a highly doped n-type programming junction 20 in the silicon wafer substrate 10.

Figure 1B:
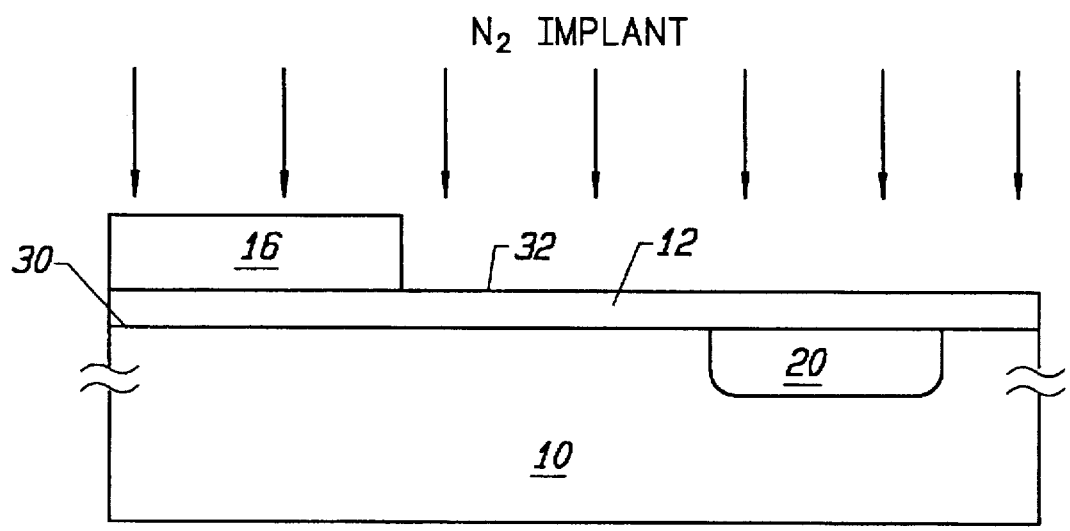

Thereafter, the masking layer 14 is removed from the surface 32 of the oxide layer 12 in preparation for nitrogen implantation. FIG. 1b shows the silicon wafer substrate 10 including the programming junction 20 undergoing nitrogen implantation. A resist layer 16 is formed on the surface 32. The resist layer 16 defines the regions of the silicon wafer substrate 10 that receive the nitrogen implant by blocking the implant in selected areas. In one embodiment, the nitrogen implant is performed with a 30 Kev ion implantation step through the oxide layer 12. The oxide layer 12 prevents damage to the surface 30 of the silicon wafer substrate 10 during the ion implantation step.

After nitrogen implantation, the silicon wafer substrate 10 is annealed to diffuse the implanted nitrogen in the silicon wafer substrate 10. In one embodiment, the anneal step on the implanted nitrogen is performed in a rapid thermal annealer.

Figure 1C:
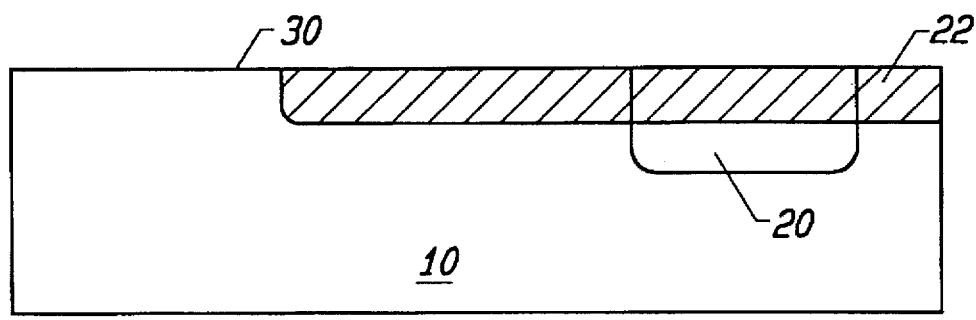

Thereafter, the masking layer 16 along with the oxide layer 12 is removed from the surface 30. FIG. 1c illustrates a nitrogen rich region 22 formed in the silicon wafer substrate 10 by the ion implantation and nitrogen anneal steps. The implanted nitrogen retards or hinders the formation of an oxide layer on the surface 30 above the nitrogen rich region 22 during a subsequent oxide formation step. On the other hand, the highly doped n-type implant enhances the formation of an oxide layer on the surface 30 above the programming junction 20 during the subsequent oxide formation step. The effects of nitrogen implant concentrations and dopant concentrations in the programming junction 20 on the resulting oxide layer is discussed below with respect to FIGS. 2 through 5.

Figure 1D:
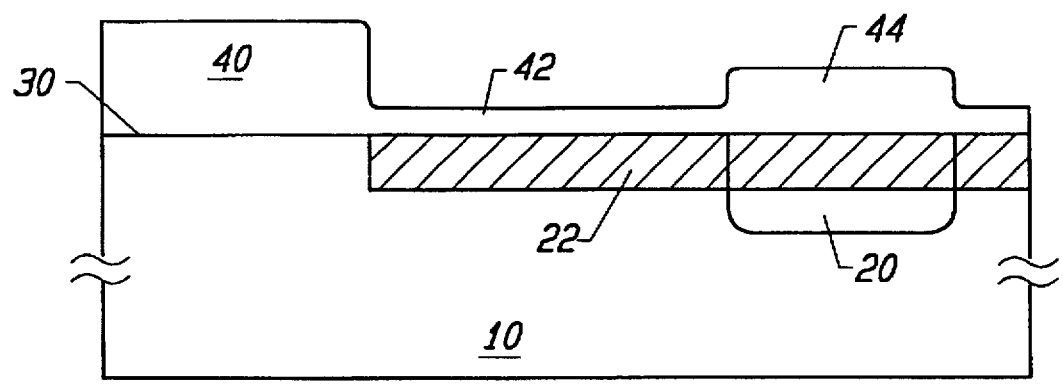

FIG. 1d illustrates the resulting oxide layer profile after a one-step oxide formation step on the silicon wafer substrate 10 targeted for a resulting oxide thickness of approximately 150Å. The resulting oxide layer includes a layer region 40 formed on the surface 30. The layer region 40 has a thickness of approximately 150Å for the oxide formation step that is precisely controlled to form a 150Å oxide layer on the silicon wafer substrate 10. The resulting oxide layer includes a layer region 42 having a thickness of approximately 70Å due to the retarding effect of the implanted nitrogen in the nitrogen region 22. The resulting oxide layer also includes a layer region 44 having a thickness of approximately 90Å due to the combined effect of the oxide retardation provided by the nitrogen region 22 and the oxide enhancement provided by the heavily doped n-type material in the programming junction 20.

Figure 2:
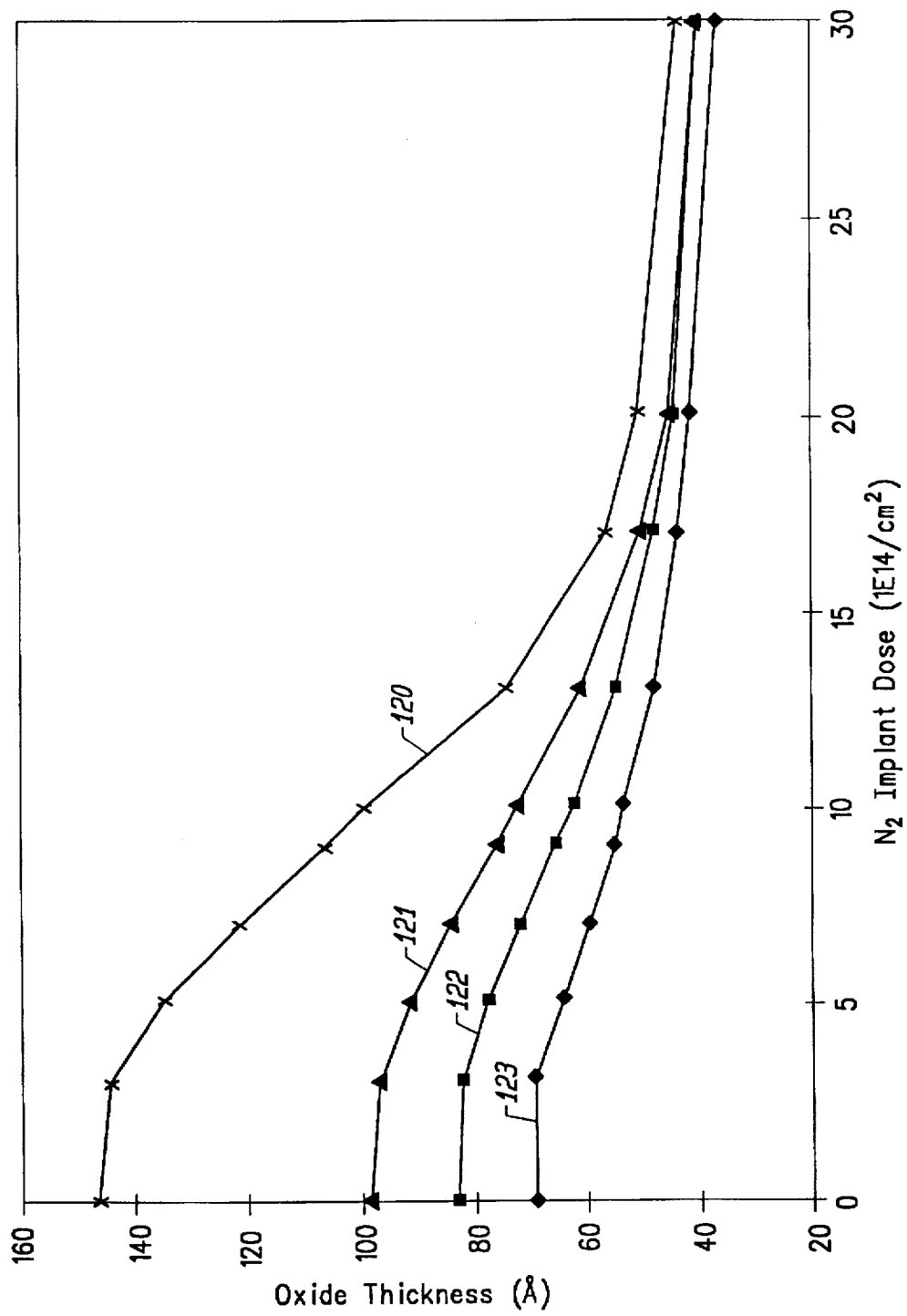
FIG. 2 illustrates the resulting thickness of oxide formation on the silicon wafer substrate in relation to implanted nitrogen concentrations.

FIG. 2 illustrates the resulting thickness of oxide formation on the silicon wafer substrate 10 in relation to implanted nitrogen concentrations. A set of curves 120–123 indicate the resulting oxide thickness versus nitrogen implant dosage for a set of example target oxide thicknesses. The curve 120 corresponds to an oxide formation recipe that targets an oxide thickness target of 150Å with no nitrogen implant in the silicon wafer substrate 10. The curve 121 corresponds to a 100Å oxide target thickness with no nitrogen implantation in the silicon wafer substrate 10. Similarly, the curves 122 and 123 represent 80Å and 68Å target oxide thicknesses, respectively, with no nitrogen implanted in the silicon wafer substrate 10.

Each curve 120–123 demonstrates the oxide retarding effect of the nitrogen implant region 22 as the nitrogen implant concentrations increase. The curves 120–123 enable the selection of implant dosages that will result in the desired oxide thicknesses in the regions 40, 42, and 44 of the resulting oxide layer formed on the surface 30. Each of the curves 120–123 correspond to a nitrogen diffusion step performed in a rapid thermal annealer for 30 seconds.

Figure 3:
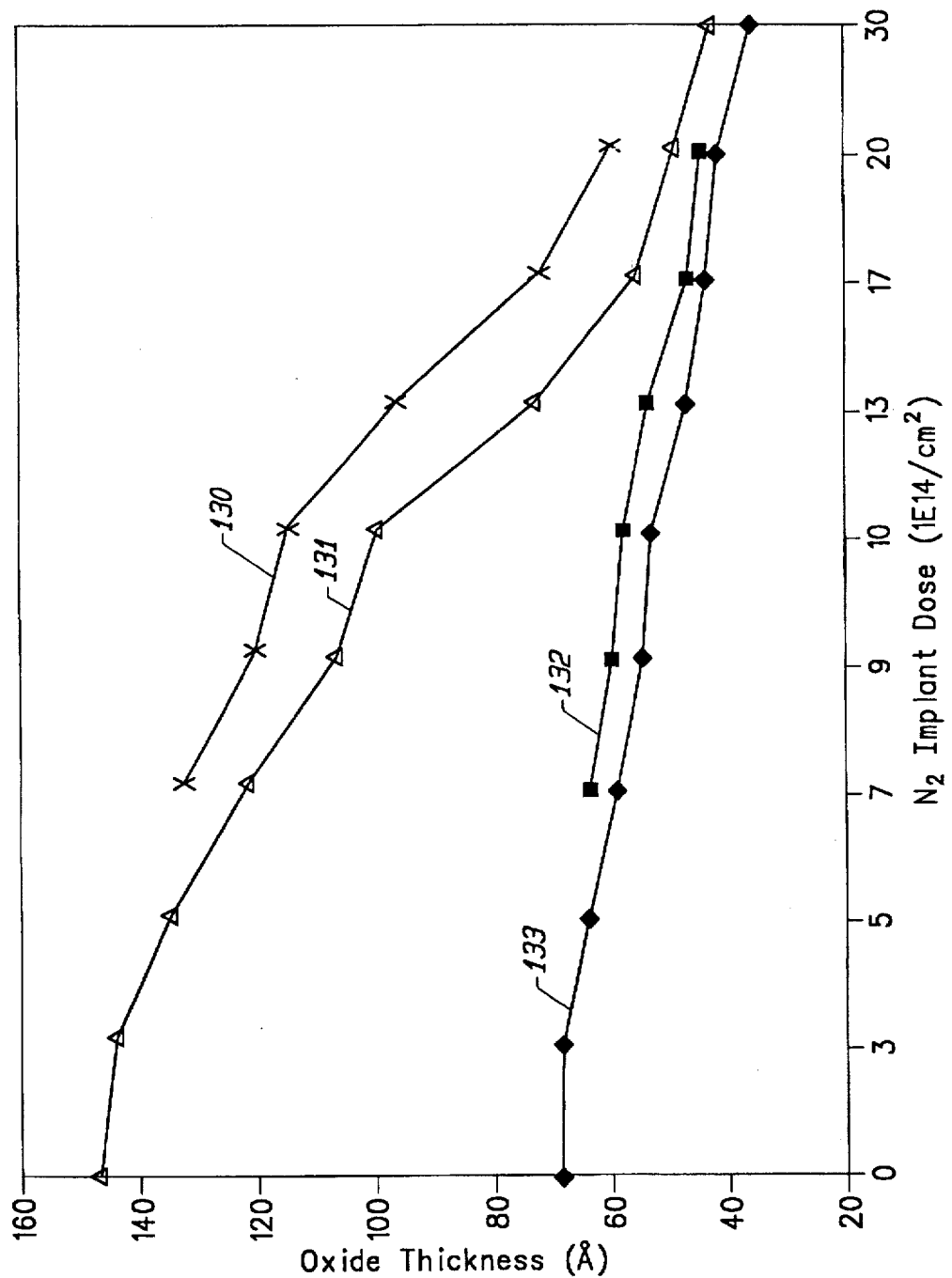
FIG. 3 illustrates the relationship between resulting oxide thickness and nitrogen implantation dosage for differing rapid thermal anneal times.

FIG. 3 illustrates the relationship between resulting oxide thickness and nitrogen implantation dosage for differing rapid thermal anneal times at 975 degrees C. A curve 130 corresponds to a 150Å oxide target thickness with no nitrogen implantation and a 60 second rapid thermal anneal time. A curve 131 corresponds to a 150Å oxide target thickness with no nitrogen implantation and a 30 second rapid thermal anneal time. A pair of curves 132 and 133 correspond to a 68Å oxide target thickness with no nitrogen implantation and 60 second and 30 second rapid thermal anneal times, respectively.

Figure 4:
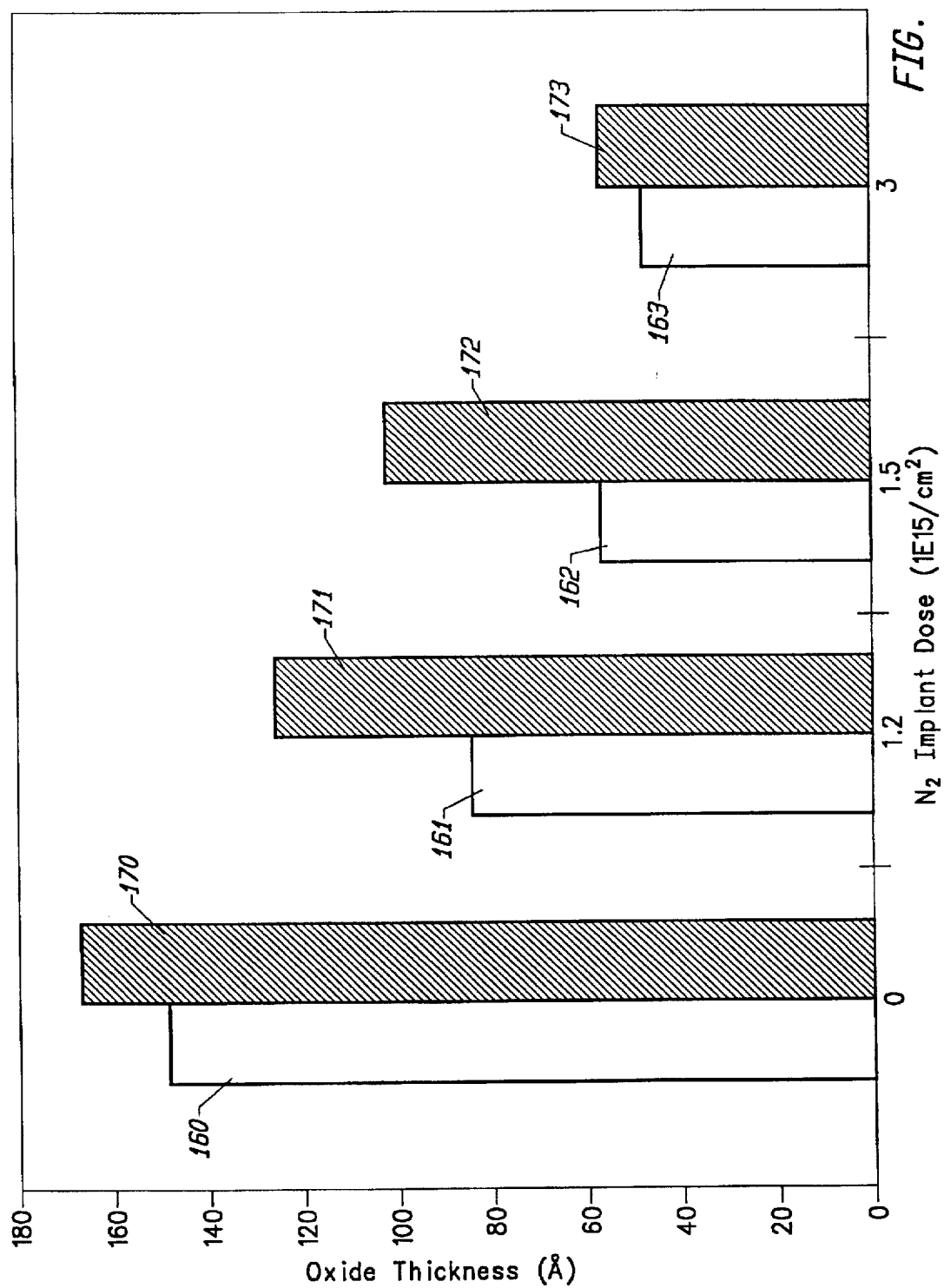
FIG. 4 shows the relationship between resulting oxide thickness and nitrogen implantation dosage with and without the oxide enhancement effects provided by the doping of the programming junction.

FIG. 4 shows the relationship between resulting oxide thickness and nitrogen implantation dosage with and without the oxide enhancement effects provided by the doping of the programming junction 20 for four different nitrogen implant dosage levels in the programming junction 20. The bars 160–163 indicate results without dopant in the programming in the programming junction 20. The bars 170–173 show results with doping.

Figure 5:
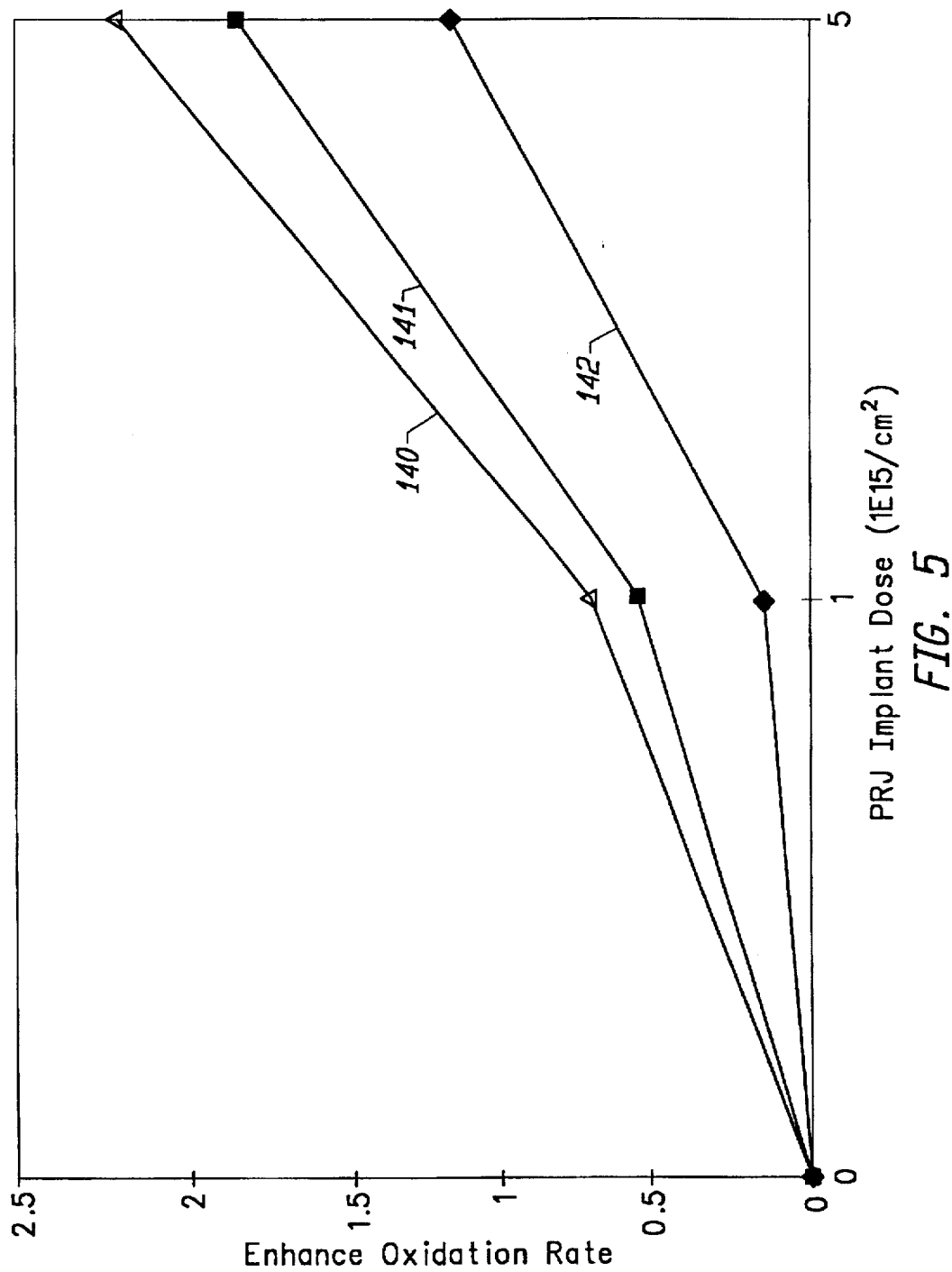
FIG. 5 illustrates the effect of nitrogen implantation into the programming junction on resulting oxide thickness.

FIG. 5 illustrates the effect of nitrogen implantation into the programming junction 20. A set of curves 140–142 show the effect of nitrogen concentrations on the enhanced oxidation caused by the doping concentrations in the programming junction 20. The curve 140 illustrates the effects on resulting oxide thickness when no nitrogen is implanted into silicon wafer substrate 10. The curve 141 shows resulting oxide thickness for a nitrogen dosage of 1.2E15 atoms per square centimeter in the programming junction 20. The curve 142 shows resulting oxide thickness for a nitrogen dosage of 1.5E15 atoms per square centimeter.

FIGS. 6a–6d illustrate a process for forming multiple oxide thicknesses on the silicon wafer substrate 50 using two separate nitrogen implantation steps. Initially, a highly doped n-type programming junction 60 is formed into the silicon wafer substrate 50. A sacrificial oxide layer 52 is then grown onto a surface 70 of the silicon wafer substrate 50.

Figure 6A:
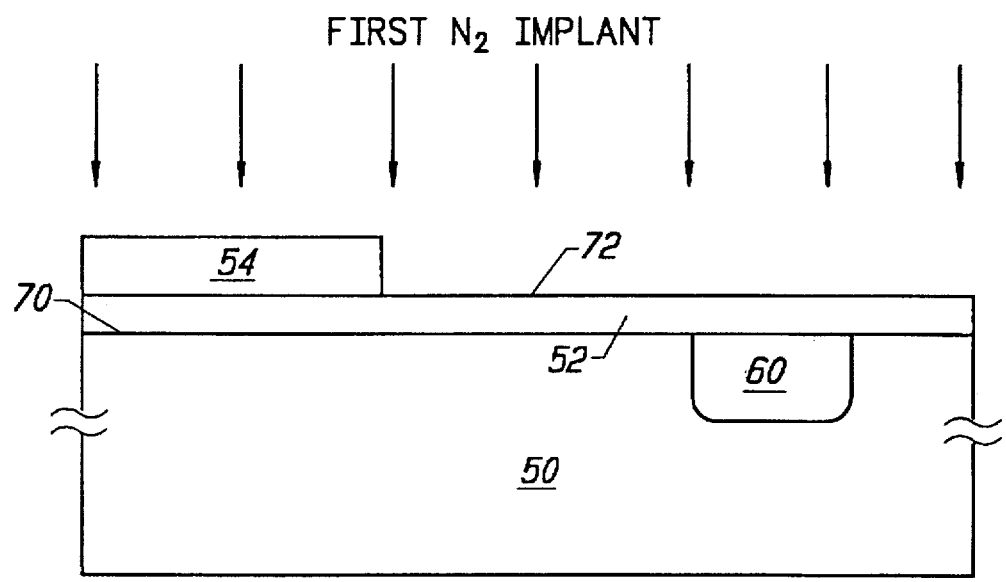
FIGS. 6a–6d illustrate a process for forming multiple oxide thicknesses on a silicon wafer substrate using two separate nitrogen implantation steps.
Figure 6B:
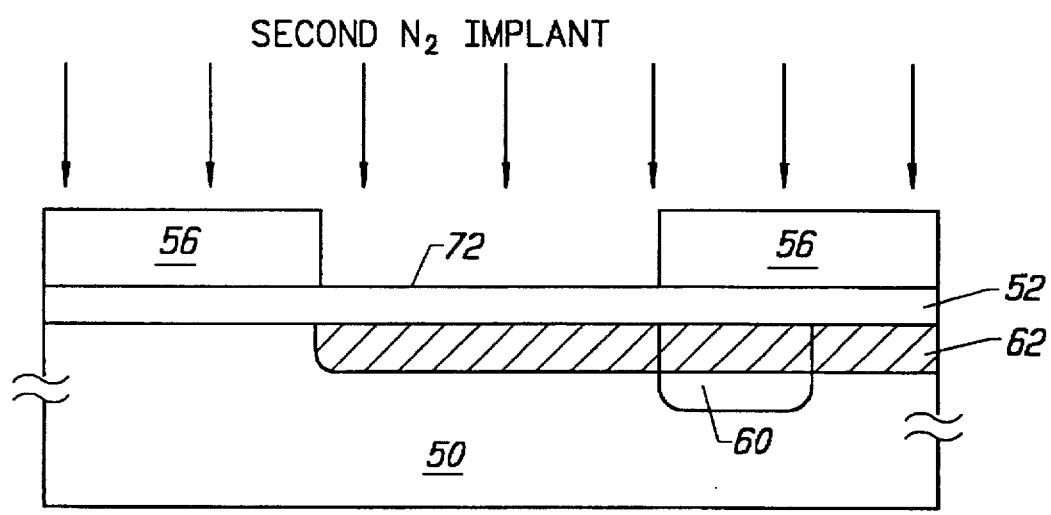

FIG. 6a shows a resist layer 54 formed onto a surface 72 of the oxide layer 52. The resist layer 54 defines the regions of the silicon wafer substrate 50 that receive the first nitrogen implant. The resist layer 54 is removed after the first nitrogen implant. Thereafter, a resist layer 56 is formed onto the surface 72 as shown in FIG. 6b. The resist layer 56 forms an opening to the surface 72 that defines regions of the silicon wafer substrate 10 that receive the second nitrogen implant.

After the first and second nitrogen implantation steps, the masking layer 56 is removed from the surface 70. The silicon wafer substrate 50 is then annealed in a rapid thermal annealer to diffuse the implanted nitrogen. Thereafter, the oxide layer 52 is removed from the surface 70.

Figure 6C:
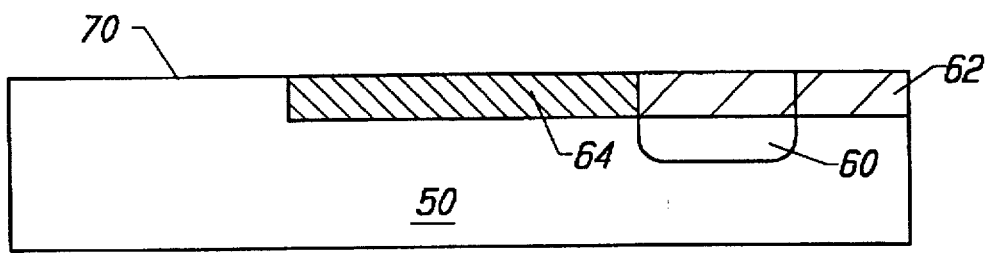

FIG. 6c illustrates a low dose nitrogen region 62 and a high dose nitrogen region 64 formed in the silicon wafer substrate 50 by the first and second ion implantation steps and the subsequent anneal step. The nitrogen dosage in the high dose nitrogen region 64 results from the combination of the first and second nitrogen implantation steps.

Figure 6D:
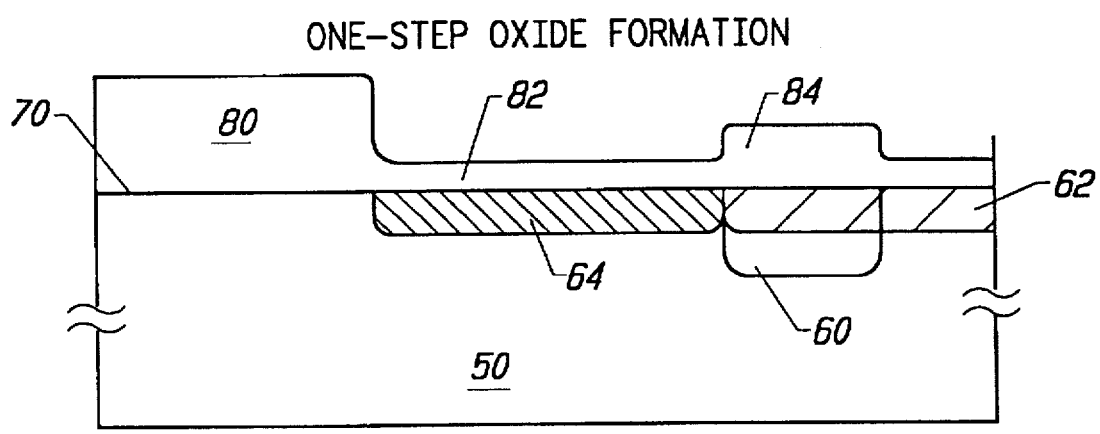

FIG. 6d illustrates the resulting oxide layer profile after a one-step oxide formation step on the silicon wafer substrate 50 which includes the nitrogen regions 62 and 64 and the programming junction 60. The resulting oxide layer includes a layer region 80 having a thickness of approximately 150Å for an oxide formation step that is targeted to form a 150Å oxide layer on the silicon wafer substrate 50. The resulting oxide layer includes a layer region 82 having a thickness of approximately 70Å due to the retarding effect of the implanted nitrogen in the high dose nitrogen region 64. The resulting oxide layer also includes a layer region 84 having a thickness of approximately 90Å due to the combined effect of the oxide retardation provided by the low dose nitrogen region 62 and the oxide enhancement provided by the heavily doped n-type material in the programming junction 60.

Figure 7A:
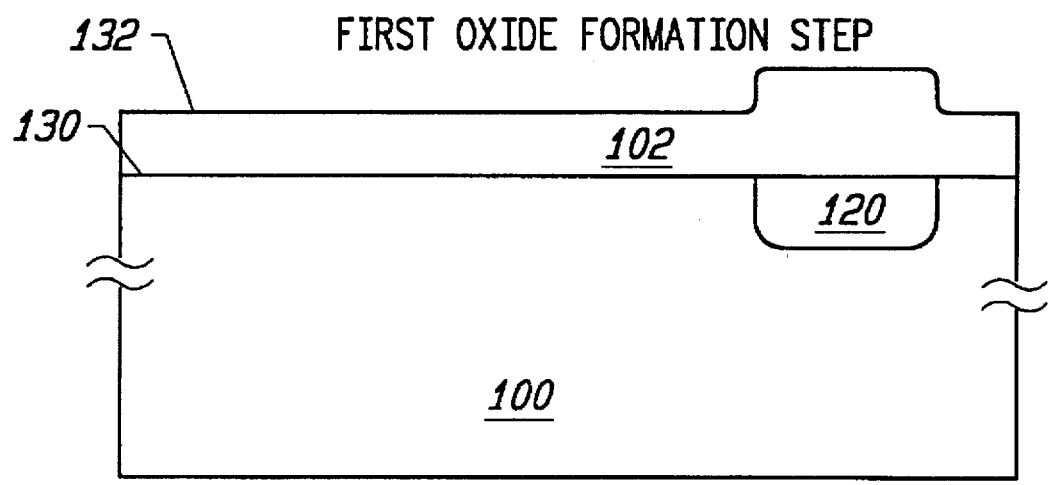
FIGS. 7a–7e illustrate a process for forming multiple oxide thicknesses on a silicon wafer substrate using two oxide formation steps.

FIGS. 7a–7e illustrate a process for forming multiple oxide thicknesses on a silicon wafer substrate 100 using two oxide formation steps. Initially, a highly doped n-type programming junction 120 is formed in the silicon wafer substrate 100. A first oxide layer 102 is grown onto a surface 130 of the silicon wafer substrate 100 as shown in FIG. 7a. In this example, the first oxide layer 102 has a thickness of approximately 125Å.

Figure 7B:
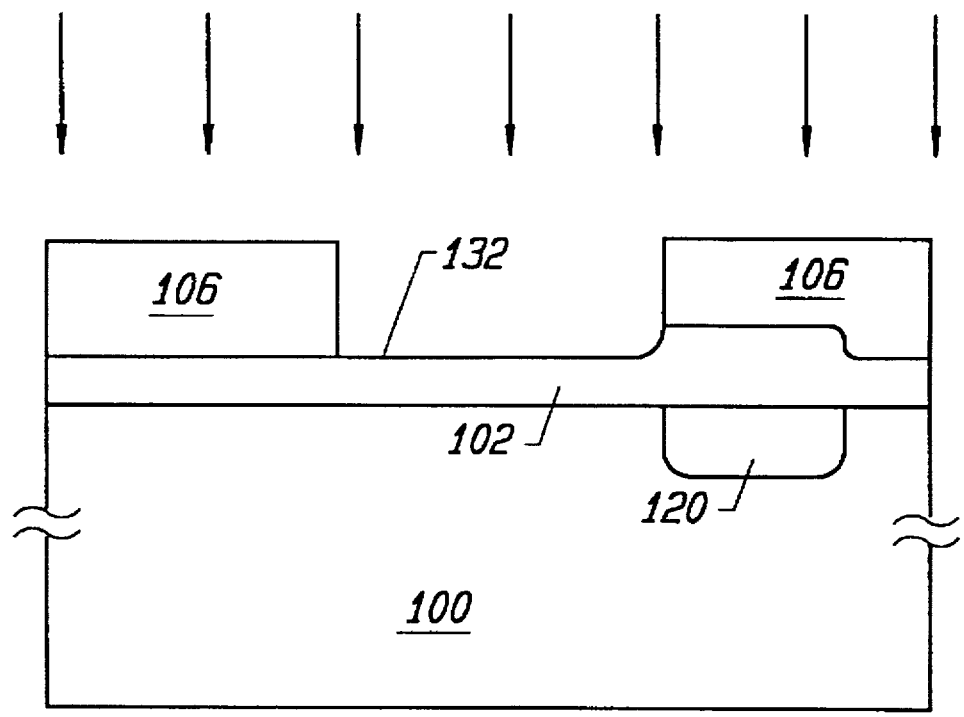

FIG. 7b shows a nitrogen implant step including a resist layer 106 formed onto a surface 132 of the first oxide layer 102. The resist layer 106 forms an opening to the surface 132 and defines regions of the silicon wafer substrate 100 that receive the nitrogen implant. After the nitrogen implantation step, the masking layer 106 is removed and then the silicon wafer substrate 100 is annealed in a rapid thermal annealer to diffuse the implanted nitrogen.

Figure 7C:
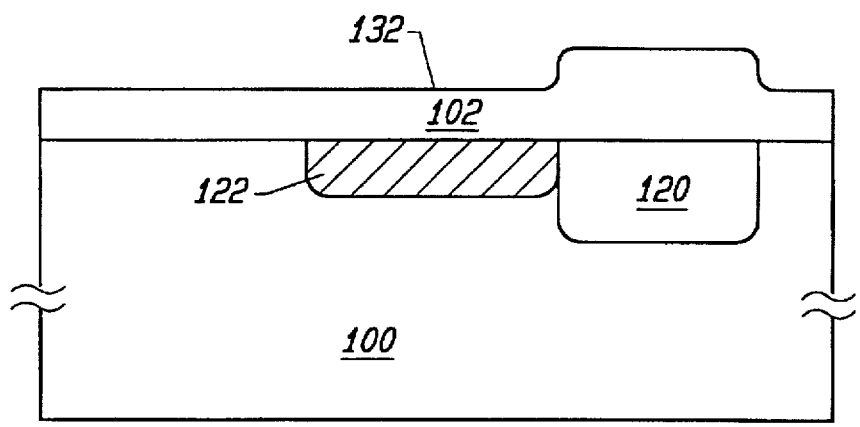
Figure 7D:
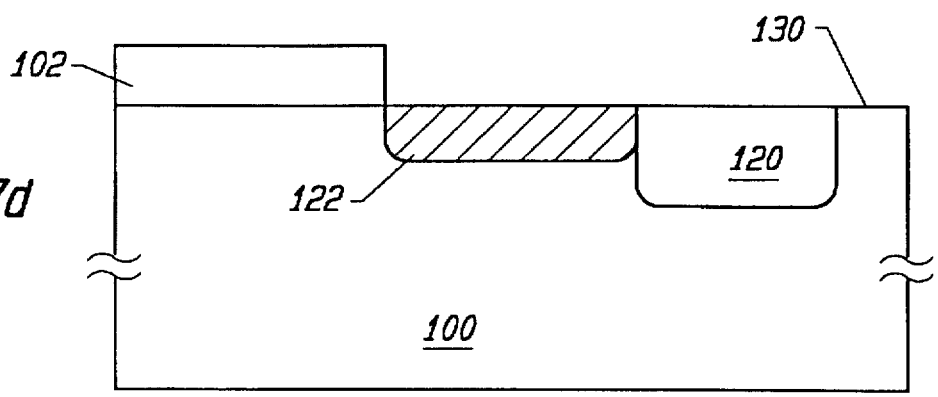

FIG. 7c illustrates a nitrogen region 122 formed in the silicon wafer substrate 100 by the nitrogen implantation and subsequent anneal steps. A resist layer is then deposited onto the surface 132 to define the thickest region of the desired resulting oxide layer. The remainder of the first oxide layer 102 is etched away from the surface 130 as shown in FIG. 7d. Thereafter, the resist on the surface 132 is removed and a second oxide formation step is performed. In this example, the second oxide layer is targeted for a thickness of approximately 80Å on an area of the surface 130 not having nitrogen implants or programming junction implants.

Figure 7E:
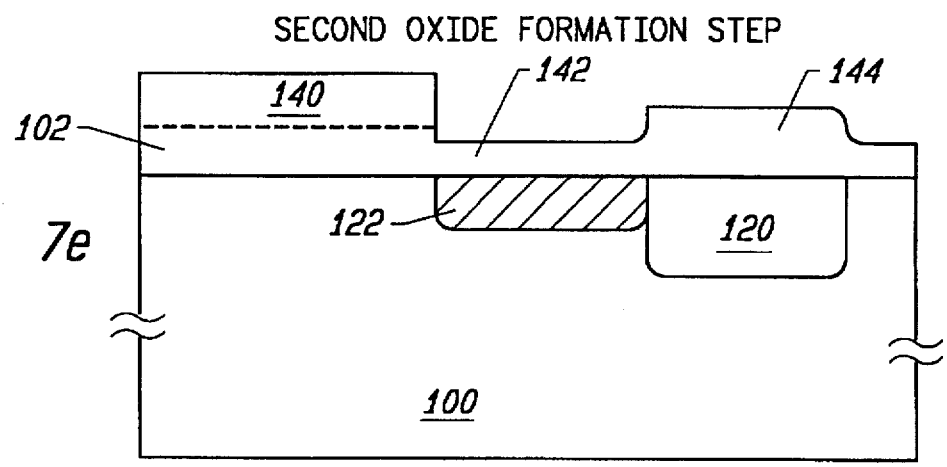

FIG. 7e illustrates the resulting oxide layer profile after the second oxide formation step on the silicon wafer substrate 100. The resulting oxide layer includes a layer region 140 having a thickness of approximately 150Å resulting from the interaction of the first and second oxide formation steps. The 125Å and 80Å steps combine to form a 150Å layer 140 due to the hindering effects on oxidation provided by the first oxide layer 102. The resulting oxide layer includes a layer region 142 having a thickness of approximately 70Å due to the retarding effect of the implanted nitrogen in the nitrogen region 122. The resulting oxide layer also includes a layer region 144 having a thickness of approximately 90Å due to the oxide enhancement provided by the heavily doped n-type material in the programming junction 120.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An integrated circuit manufacturing process, comprising the steps of:
   forming a first region in a substrate wherein the first region contains a dopant that enhances oxide formation;
   forming a second region in the substrate wherein the second region contains a dose of nitrogen that retards oxide formation;
   forming an oxide layer over the first and the second regions and over a third region of the substrate such that the first, second, and third regions yield differing thicknesses of the oxide layer.

2. The process of claim 1, wherein the dopant in the first region is an n-type dopant.

3. The process of claim 5, wherein the dopant in the first region is selected to form a programming junction for a non-volatile memory or programmable logic device.

4. The process of claim 1, wherein the dose of nitrogen is selected according to a difference between the thicknesses of the third and the second regions of the oxide layer.

5. The process of claim 4, wherein a concentration of the dopant in the first region is selected according to a difference between the thicknesses of the second and the first regions of the oxide layer.

6. The process of claim 1, wherein the step of forming a second region in the substrate includes the step of performing an ion implantation into the second region.

7. The process of claim 6, wherein the step of forming a second region in the substrate further includes the step of annealing the substrate.

8. The process of claim 6, wherein the thickness of the second region is controlled by the dose of nitrogen and an anneal time for the second region and by a target thickness of the oxide layer.

9. The process of claim 1, wherein the dose of nitrogen is formed in a series of separate nitrogen implantation steps.

10. An integrated circuit manufacturing process, comprising the steps of:

forming a first region in a substrate wherein the first region contains a dopant that enhances oxide formation on the first region;

implanting a dose of nitrogen into the first region and into a second region in the substrate such that the dose of nitrogen retards oxide formation on the first and the second regions;

forming an oxide layer over the first and the second regions and over a third region of the substrate such that the first, second, and third regions yield differing thicknesses of the oxide layer.

11. The process of claim 10, wherein the dopant in the first region is an n-type that forms a programming junction for a non-volatile memory or programmable logic device.

12. The process of claim 10, wherein the dose of nitrogen is selected according to a difference between the thicknesses of the third and the second regions of the oxide layer and a difference between the third and the first regions of the oxide layer.

13. The process of claim 12, wherein a concentration of the dopant in the first region is selected according to a difference between the thicknesses of the second and the first regions of the oxide layer.

14. The process of claim 10, wherein the step of implanting a dose of nitrogen includes the step of performing an ion implantation into the first and the second regions.

15. The process of claim 4, wherein the step of implanting a dose of nitrogen further includes the step of annealing the substrate.

16. The process of claim 15, wherein the thickness of the second region is controlled by the dose of nitrogen and an anneal time for the substrate and by a target thickness for the oxide layer.

17. The process of claim 10, wherein the dose of nitrogen in the first region and the second region are implanted in separate nitrogen implantation steps.

18. The process of claim 17, wherein the first and the second regions are implanted with differing doses of nitrogen.

19. An integrated circuit manufacturing process, comprising the steps of:

forming a first region in a substrate wherein the first region contains a dopant that enhances oxide formation on the first region;

forming a first oxide layer on the substrate;

implanting a dose of nitrogen into a second region in the substrate through the first oxide layer such that the dose of nitrogen retards oxide formation on the second region;

removing the first oxide layer over the first and the second regions;

forming a second oxide layer over the first and the second regions and over a third region of the substrate such that the first and the second regions yield differing thicknesses of the second oxide layer and the first and second oxide layers combine over the third region.

20. The process of claim 19, wherein the dopant in the first region is an n-type that forms a programming junction for a non-volatile memory or programmable logic device.

21. The process of claim 19, wherein the dose of nitrogen is selected according to a difference between the thicknesses of the first and the second regions of the second oxide layer.

22. The process of claim 19, wherein the step of implanting a dose of nitrogen includes the step of performing an ion implantation into the second region.

23. The process of claim 22, wherein the step of implanting a dose of nitrogen further includes the step of annealing the substrate.

24. The process of claim 23, wherein the thickness of the second region is controlled by the dose of nitrogen and an anneal time for the substrate and by a target thickness for the second oxide layer.

* * * * *

UNITED STATES PATENT AND TRADEMARK OFFICE
CERTIFICATE OF CORRECTION

PATENT NO. : 5,672,521
DATED : September 30, 1997
INVENTOR(S) : Barsan et al.

It is certified that error appears in the above-indentified patent and that said Letters Patent is hereby corrected as shown below:

Column 6, line 52, change "claim 5" to --claim 1--.

Signed and Sealed this

Tenth Day of February, 1998

Attest:

BRUCE LEHMAN

Attesting Officer  Commissioner of Patents and Trademarks